United States Patent [19]

Kawabe

[11] 4,338,620
[45] Jul. 6, 1982

[54] SEMICONDUCTOR DEVICES HAVING IMPROVED ALIGNMENT MARKS

[75] Inventor: Yunosuke Kawabe, Yokohama, Japan

[73] Assignee: Fujitsu Limited, Kawasaki, Japan

[21] Appl. No.: 137,804

[22] Filed: Apr. 4, 1980

Related U.S. Application Data

[62] Division of Ser. No. 71,085, Aug. 31, 1979, Pat. No. 4,233,091.

[30] Foreign Application Priority Data

Aug. 31, 1978 [JP] Japan .................. 53-106677

[51] Int. Cl.³ .................. H01L 21/76; H01L 21/95
[52] U.S. Cl. .................................. 357/50; 357/55; 357/85
[58] Field of Search .................. 357/50, 49, 40, 55, 357/56, 60, 85

[56] References Cited

U.S. PATENT DOCUMENTS

| | | | |
|---|---|---|---|
| 3,623,218 | 11/1971 | Mitari et al. | 357/49 |
| 3,624,463 | 11/1971 | Davidsohn | 357/49 |
| 3,766,438 | 10/1973 | Castrucci | 357/49 |
| 3,783,044 | 1/1974 | Cheskis | 148/175 |
| 3,844,858 | 10/1974 | Bean | 357/49 |
| 3,847,687 | 11/1974 | Davidsohn | 148/187 |
| 3,975,221 | 8/1976 | Rodgers | 357/55 |
| 4,037,306 | 7/1977 | Gutteridge et al. | 357/49 |
| 4,187,516 | 2/1980 | Legat et al. | 357/49 |

Primary Examiner—William D. Larkins

[57] ABSTRACT

A semiconductor device comprises a V-groove isolation structure and an alignment mark having a sharp contour. The alignment mark consists of a locally thick portion of an oxide layer covering an epitaxial layer in which a V-groove is formed. The alignment mark is produced by a thermal oxidizing operation involved in the manufacturing procedure of the V-groove isolation structure.

7 Claims, 14 Drawing Figures

SEMICONDUCTOR DEVICES HAVING IMPROVED ALIGNMENT MARKS

This is a division of application Ser. No. 071,085, filed Aug. 31, 1979, now U.S. Pat. No. 4,233,091.

BACKGROUND OF THE INVENTION

1. Field of the Invention

This invention relates to semiconductor devices having a V-groove isolation polycrystal backfill (VIP) structure type, and particularly to semiconductor devices of the VIP structure type having improved alignment marks and a method of manufacturing the same.

2. Description of the Prior Art

Generally, isolation between elements of a semiconductor device is indispensable to a bipolar semiconductor device, for example, a bipolar integrated circuit (IC). Such isolation can be accomplished with a PN junction isolation, an insulating material isolation or an air isolation. The insulating material isolation, particularly, a VIP structure isolation has a superior isolation ability and results in a denser integrated circuit as compared with the PN junction isolation and the air isolation. Consequently, insulating material isolation is generally used in a bipolar semiconductor device (see, for example, cf. Stephen Wm. Fields: Electronics, July 3 (1972), pp. 65–66.

In a case where a bipolar semiconductor device having a VIP structure isolation is manufactured, the VIP structure isolation and an alignment mark are (simultaneously) formed. The alignment mark is necessary for masks, i.e. pattern masks, which are used in formation of the steps of active elements, passive elements and a patterned metal layer of a semiconductor device. However, since the structure of the alignment marks which have been hitherto formed has been the same as that of the VIP structure isolation, the contour of the alignment mark has not been sharp. Such non-sharp contour is inconvenient for mask alignment operations. This inconvenience will now be explained with reference to the attached FIGS. 1 through 7.

FIGS. 1 through 6 are partial cross-sectional views of a semiconductor device having a conventional alignment mark in various stages of its manufacture by a method in accordance with prior art techniques.

A substrate 1 (FIG. 1) is made by cutting a p-type single-crystal silicon along the (100) plane and then highly polishing it. N+-type regions 2 are produced as buried layers by a conventional technique, e.g. an ion implantation of n-type dopants. An n-type silicon semiconductor layer 3 is formed on the silicon substrate 1 by an epitaxial growth method. The surface of the silicon semiconductor layer 3 is the (100) plane. Then, a silicon dioxide ($SiO_2$) layer 4 is formed on the silicon semiconductor layer 3 by a conventional technique, e.g. thermal oxidation of silicon. A silicon nitride ($Si_3N_4$) layer 5 is formed on the $SiO_2$ layer 4 by a conventional technique, e.g. chemical vapor deposition (CVD), and thus, a structure as illustrated in FIG. 1 is formed.

The $Si_3N_4$ layer 5 is selectively etched by a conventional photolithography technique to form openings. In the openings parts corresponding to an isolation area and to an alignment mark area of the $SiO_2$ layer 4 are exposed. Then, using the $Si_3N_4$ layer 5 having the patterned opening as a mask, the $SiO_2$ layer 4 is etched to form openings 6 and 7 as illustrated in FIG. 2, which is a sectional view taken along line II—II of FIG. 7. In the opening 6 a part corresponding to the isolation area of the silicon epitaxial layer 3 is exposed, and in the opening 7 a part corresponding to the alignment mark area of the silicon epitaxial layer 3 is exposed (cf. FIG. 7 being a plan view of FIG. 2). In FIG. 7 the opening 7 of the alignment mark area is in the shape of a rectangular band surrounding a portion of the $Si_3N_4$ layer 5. However, the alignment mark area opening may have any suitable shape (e.g. a T shape, an X shape).

The portions of the silicon epitaxial layer 3 within the openings 6 and 7 are anisotropically etched with an etchant, of which the chief ingredient is potassium hydroxide (KOH), to form V-grooves 8 as illustrated in FIG. 3. A silicon dioxide layer 9 (FIG. 4) is formed by thermaly oxidizing the surface of the V-grooves 8. During the thermal oxidizing operation, the remaining insulating layer 5 acts as a mask against oxidation. A polycrystalline silicon layer 10 is formed on the entire exposed surface by a chemical vapor deposition method, as illustrated in FIG. 4. The polycrystalline silicon layer 10 is polished to leave a part of it in the V-groove only, as illustrated in FIG. 5. When the polishing operation is carried out, the edges of the remaining insulating layer 5 are broken off and the center portion of the remaining polycrystalline silicon layer 10 in the V-grooves is slightly dented, as illustrated in FIG. 5.

The remaining polycrystalline silicon layer 10 in the V-grooves 8 is thermaly oxidized to form a thick silicon dioxide ($SiO_2$) layer 4' (FIG. 6). Thus, an alignment mark and a VIP structure of a semiconductor device are simultaneously completed, and isolated element areas 3' (FIG. 6) are formed. Then, the remaining insulating layer 5 is removed, so that a structure as illustrated in FIG. 6 is obtained.

Thereafter, a bipolar transistor or a passive element is formed in each of the isolated element areas 3' by conventional techniques which use patterned masks. Each of the patterned masks should be aligned with the above-mentioned alignment mark. However, the formed alignment mark has a non-sharp contour, since the surface of the polished polycrystalline silicon layer is concave and a large "bird's beak" is generated during the thermal oxidation of the polished polycrystalline silicon. Namely, the width $W_1$ (FIG. 6) of a slanted side of the alignment mark is from 1.0 to 2.0 microns, usually approximately 1.5 microns.

SUMMARY OF THE INVENTION

It is an object of the present invention to provide an alignment mark having a sharper contour than that of a conventional alignment mark.

It is another object of the present invention to provide an alignment mark for an accurate mask alignment.

It is a further object of the present invention to provide a semiconductor device of a VIP structure type having a sharp alignment mark and a method of manufacturing the same.

The above and other objects of the present invention are achieved by providing a semiconductor device which comprises a VIP structure and an alignment mark which consists of a locally thick portion of an oxide layer covering a silicon epitaxial layer of the VIP structure and is located a certain distance from a V-groove. Briefly, what distinguishes the method of manufacturing the semiconductor device of the present invention from a conventional manufacturing method is the protection of an exposed part corresponding to an alignment mark area of the oxide layer from an etchant during the etching operation of the oxide layer and the formation of the alignment mark by the thermal oxidation of a part of the silicon epitaxial layer through the exposed part of the oxide layer.

BRIEF DESCRIPTION OF THE INVENTION

DETAILED DESCRIPTION OF THE INVENTION

Figure 8:
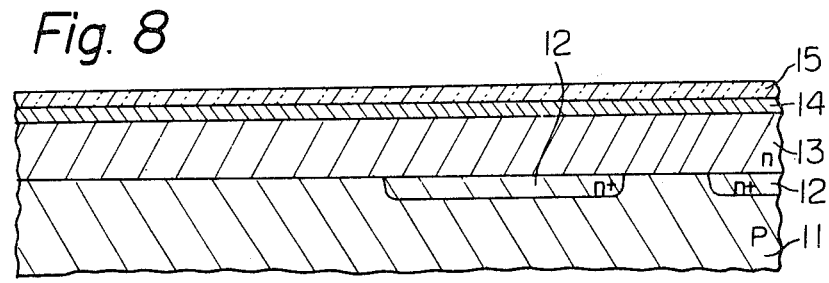
FIGS. 8 through 13 are partial cross-sectional views views of a semiconductor device according to the present invention in various shapes of its manufacture.

In accordance with one embodiment of the present invention, a substrate 11 (FIG. 8) of p-type single-crystal silicon with the (100) plane surface is used to form a bipolar semiconductor device having an alignment mark. While the manufacture on the substrate of only a part of one semiconductor device is illustrated in FIGS. 8 through 13, common practice is to use a single-crystal silicon substrate (wafer) for a large number of semiconductor devices. N+-type regions 12 are produced as buried layers by an ion implantation of n-type dopants (e.g. arsenic phosphorus, antimony). An n-type silicon epitaxial layer 13 with the (100) plane surface is formed on the silicon substrate 11 by a conventional vapor epitaxial growth method. The thickness of the epitaxial layer 13 is from 1.5 to 3.5 microns. An oxide layer 14 (e.g. silicon dioxide layer), having a thickness of from 1000 to 1500 Å, is formed on the silicon epitaxial layer 13 by thermal oxidation of the epitaxial layer 13 at approximately 1000° C. Then, a masking layer 15 (e.g. silicon nitride layer), having a thickness of from 1000 to 2500 Å, is formed on the oxide layer 14 by chemical vapor deposition, as illustrated in FIG. 8. The masking layer 15 serves as an antioxidation mask when an oxidation operation is carried out.

Figure 9:
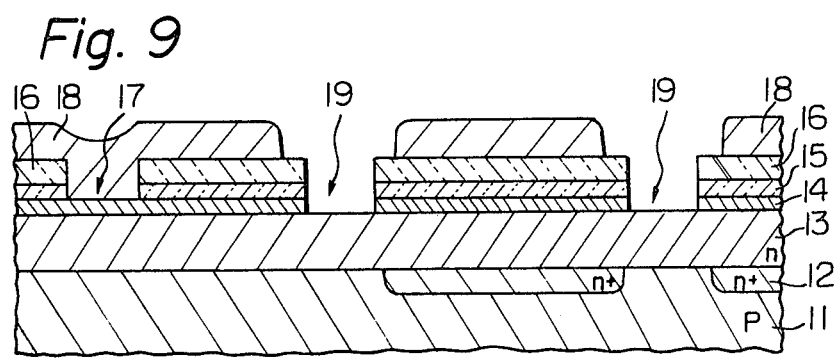

A first photoresist film 16 (FIG. 9), having a thickness of from 8000 to 10,000 Å, is applied onto the masking layer 15. Then, the first photoresist film 16 is patterned. By using the patterned photoresist film 16 as a mask the masking layer 15 is etched so that a part corresponding to an isolation area 19 of the oxide layer 14 and an alignment mask area 17 of the oxide layer 14 are exposed. A second photoresist film 18, having a thickness of from 8000 to 10,000 Å, is applied onto the entire exposed surface of the first photoresist film 16 and the oxide layer 14. The second photoresist film 18 is then patterned. By using the patterned photoresist films 18 and 16 only the exposed part of the oxide layer 14 is etched, so that an isolation area 19 of the silicon epitaxial layer 13 is exposed as illustrated in FIG. 9. During the latter etching operation the alignment mark area 17 of the oxide layer 14 is covered with the second photoresist film 18, so that the area 17 of the oxide layer 14 is not etched, as illustrated in FIG. 9.

Figure 1:
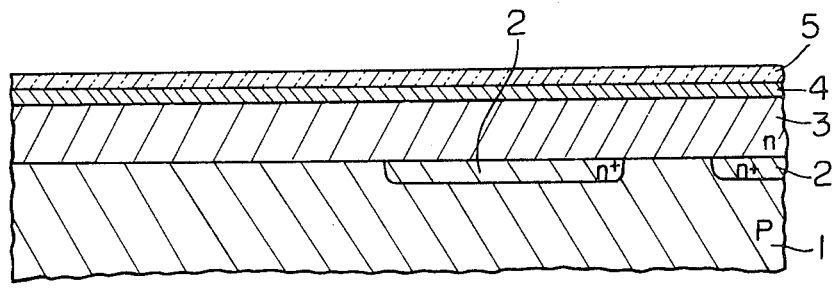
FIGS. 1 through 6 are partial cross-sectional views of a semiconductor device having a conventional alignment mark in various stages of its manufacture.
Figure 2:
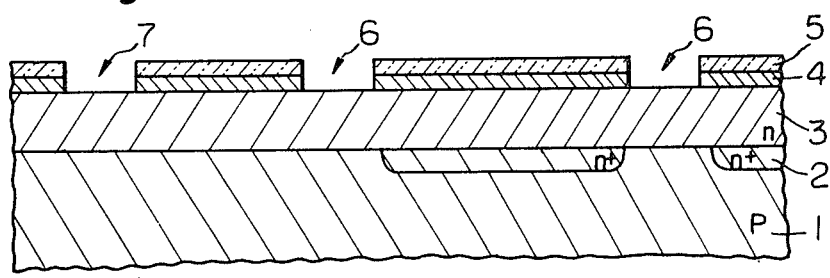
Figure 3:
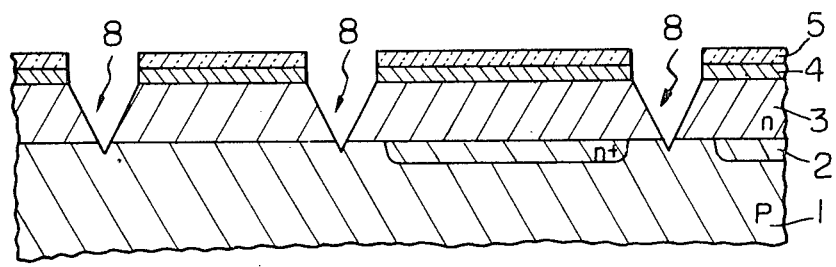
Figure 4:
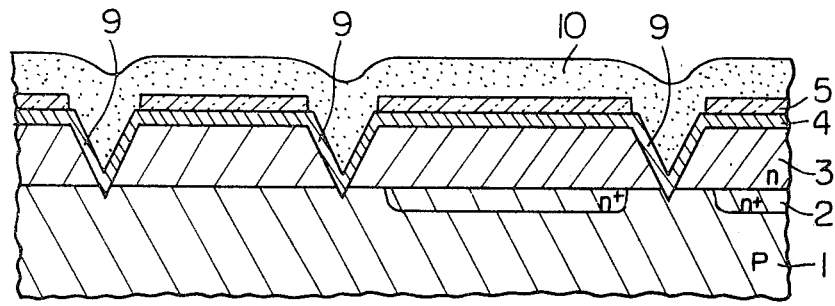
Figure 5:
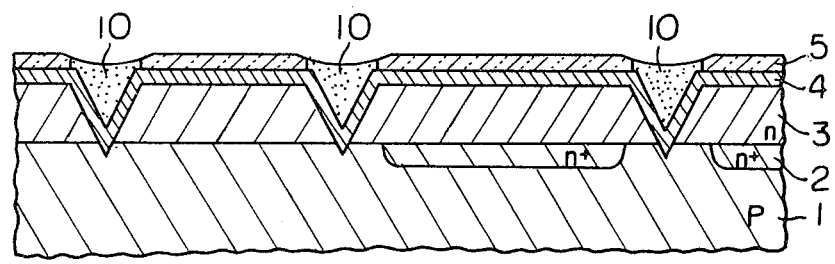
Figure 6:
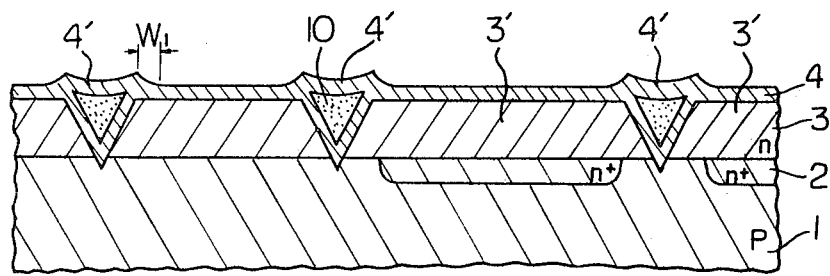
Figure 7:
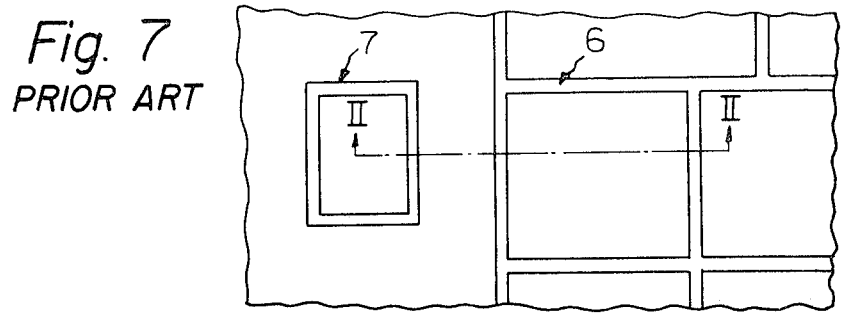
FIG. 7 is a partial plan view of the semiconductor device of FIG. 2.
Figure 10:
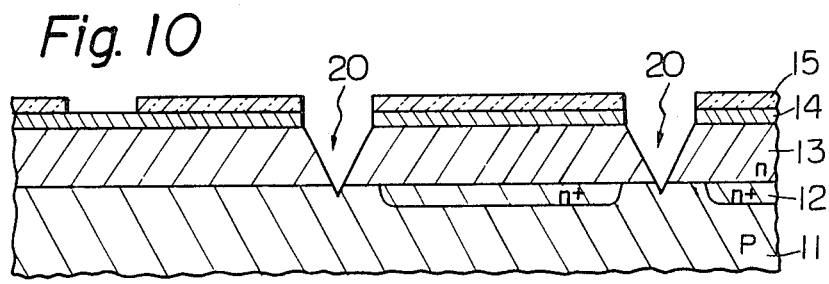
Figure 14:
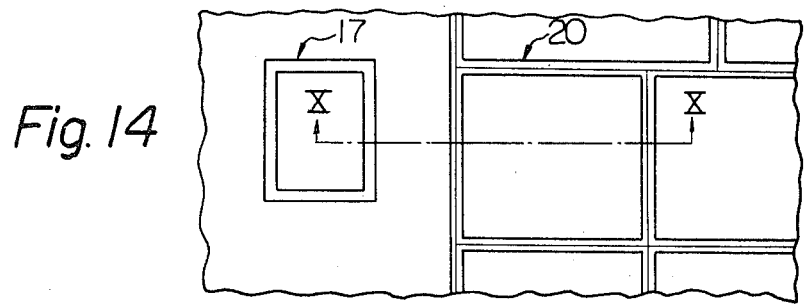
FIG. 14 is a partial plan view of the semiconductor device of FIG. 9.

Next, the patterned photoresist films 16 and 18 are removed. Only the exposed area 19 of the silicon epitaxial layer is anisotropically etched to form a V-groove 20 which have a depth to reach the silicon substrate 11, as illustrated in FIGS. 10 and 14. FIG. 14 is a plan view of FIG. 10, and FIG. 10 is a sectional view taken along line X—X of FIG. 14. In the case of FIG. 14, the alignment mark area 17 of the oxide layer is in the shape of a rectangular band surrounding a portion of the masking layer 15 as in the case of FIG. 7.

Figure 11:
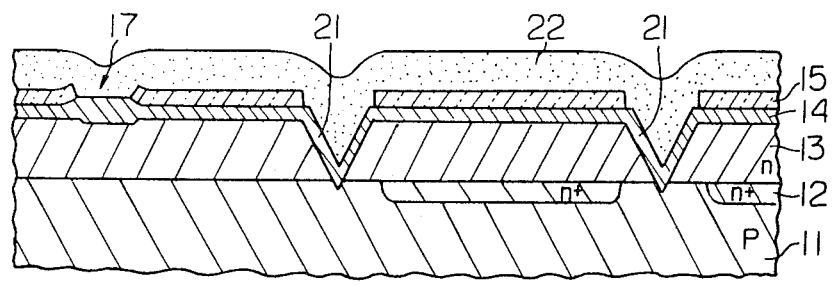

A silicon dioxide layer 21, having a thickness of approximately 5000 Å, is formed by thermally oxidizing the surface of the V-groove 20. When this thermal oxidation operation is carried out, simultaneously a part of the region of the silicon epitaxial layer 13 which lies under the alignment mark area 17 of the oxide layer 14 is oxidized, so that the thickness of the oxide layer 14 at the alignment mark area 17 is increased to approximately 6500 Å. Then, a polycrystalline silicon layer 22, having a thickness of approximately 8 microns, is formed on the entire exposed surfaces of the masking layer 15, and the oxide layers 14 and 21, by a chemical vapor deposition method, as illustrated in FIG. 11.

Figure 12:
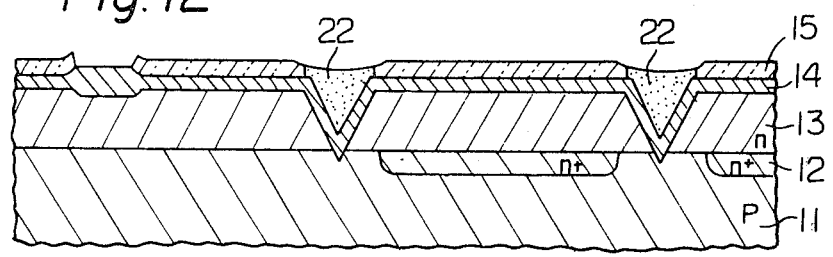

The polycrystalline silicon layer 22 is polished to leave a part of it in the V-groove only as illustrated in FIG. 12. A part of the polycrystalline silicon layer 22 on the alignment mark area 17 can be completely removed without breaking the edge of the insulating layer 14.

Figure 13:
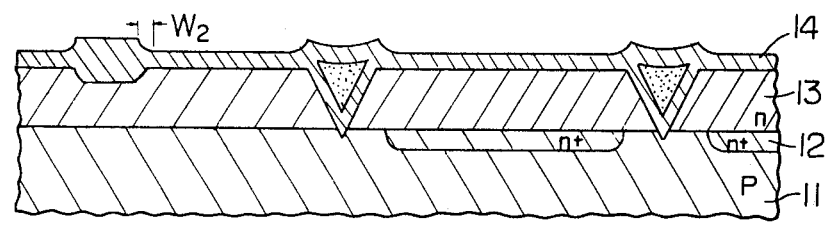

The thermal oxidation operation of silicon is again carried out, in order to oxidize the surface of the remaining polycrystalline silicon layer 22 in the V-groove 20. During the oxidation operation, the part of the region of the silicon epitaxial layer 13 which lies under the alignment mark area 17 of the oxide layer 14 is further oxidized so that the thickness of the area 17 of the oxide layer 14 is increased to approximately 10,000 Å. During the thermal oxidation operations a small bird's beak is inevitably generated at the end portion of the area 17 of the oxide layer 14. Lastly, the remaining masking layer 15 is removed and, thus, an alignment mark 23 is completed, as illustrated in FIG. 13. The width $W_2$ (FIG. 13) of the slanted side of the formed alignment mark 23 is from 0.5 to 1.0 microns. This width $W_2$ of the alignment mark according to the present invention is from one third to one half of the width $W_1$ of the conventional alignment mark. Since the alignment mark in the semiconductor device according to the present invention has the abovementioned sharp contour, mask alignment operations can be easily and accurately carried out. The alignment mark according to the present invention is formed in each of the semiconductor devices (chips) formed on a semiconductor wafer. Furthermore, by the method of the present invention at least two large alignment marks may be formed as marks for placing a patterned photomask above a semiconductor wafer by a visual alignment operation.

It will be obvious that the present invention is not restricted to the above-described embodiment and that many variations are possible for those skilled in the art without departing from the scope of this invention. For example, an n-type single-crystal silicon substrate and a p-type silicon epitaxial layer can be used instead of the p-type single-crystal silicon substrate and the n-type silicon epitaxial layer. Furthermore, shape of the alignment mark to be formed may be any suitable shape (e.g. a T shape, an X shape).

What is claimed is:

1. A semiconductor device having plural areas for active elements and at least one alignment mark apart from said areas for impurity introducing and conductor pattern forming steps for producing said semiconductor device, said device comprising
a semiconductor substrate, an epitaxial layer which is formed on said semiconductor substrate to have a V-groove extending from the surface of said epitaxial layer to said semiconductor substrate for V-groove isolation of said active elements in said plural areas, the side walls of said V-groove being coated with a thin oxide layer, and said V-groove being filled with polycrystalline silicon having an oxidized portion at the top of said V-groove an oxide layer formed on said epitaxial layer to comprise said alignment mark, said alignment mark comprising a locally thick portion of said oxide layer which is located at a predetermined distance from said V-groove on the other side of said V-groove from one of said areas for said active elements, said locally thick portion having an upper surface that is higher than the upper surface of at least a portion of the oxide layer adjacent to said locally thick portion, said alignment mark having a slanted side between said locally thick portion and said adjacent portion of said oxide layer, the width of said slanted side being no larger than 1 micron.

2. The device of claim 1, wherein the width of the slanted side is in the range down to 0.5 microns.

3. The device of claim 1 or 2, said epitaxial layer having a thickness in the range from 1.5 to 3.5 microns.

4. The device of claim 1 or 2, said portion of said oxide layer adjacent said alignment mark having a thickness in the range from 1000 to 1500 angstroms.

5. The device of claim 1 or 2, said locally thick portion of said oxide layer comprising said alignment mark having a thickness of at least one micron.

6. The device of claim 3, said locally thick portion of said oxide layer having a thickness of at least one micron.

7. The device of claim 4, said locally thick portion of said oxide layer having a thickness of at least one micron.

* * * * *

UNITED STATES PATENT AND TRADEMARK OFFICE
CERTIFICATE OF CORRECTION

PATENT NO. : 4,338,620

DATED : 6 July 82

INVENTOR(S) : YUNOSUKE KAWABE

It is certified that error appears in the above-identified patent and that said Letters Patent is hereby corrected as shown below:

```
Front Page,    after "Primary Examiner--William D. Larkins"
               insert --Attorney, Agent, or Firm--Staas & Halsey--.
Column 3,      line 13, delete "views";
               line 14, "shapes" should be --stages--;
               line 14, ", and;" should be --; and--;
               line 53, "surface" should be --surfaces--.
Column 4,      line 43, "abovementioned" should be
               --above-mentioned--.
```

Signed and Sealed this

Ninth Day of November 1982

[SEAL]

Attest:

GERALD J. MOSSINGHOFF

Attesting Officer

Commissioner of Patents and Trademarks